US009200924B2

(12) United States Patent
Granig et al.

(10) Patent No.: US 9,200,924 B2
(45) Date of Patent: *Dec. 1, 2015

(54) MAGNETIC OUT-OF-AXIS ANGLE SENSING PRINCIPLE (71) Applicant: Infineon Technologies AG, Neubiberg (DE)

(72) Inventors: Wolfgang Granig, Seeboden (AT); Gernot Binder, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/601,385

(22) Filed: Jan. 21, 2015

(65) Prior Publication Data
US 2015/0130446 A1 May 14, 2015

Related U.S. Application Data (63) Continuation of application No. 13/557,571, filed on Jul. 25, 2012, now Pat. No. 8,952,683.

(51) Int. Cl.
G01B 7/30 (2006.01)
G01D 5/12 (2006.01)
G01R 33/025 (2006.01)
(Continued)

(52) U.S. Cl.
CPC ............... *G01D 5/12* (2013.01); *G01D 5/145* (2013.01); *G01D 5/244* (2013.01); *G01R 33/025* (2013.01)

(58) Field of Classification Search
CPC ............................ G01D 5/145; G01D 5/245
USPC ................ 324/207.21, 207.25, 252
See application file for complete search history.

(56) References Cited

U.S. PATENT DOCUMENTS 6,573,710 B1 6/2003 Santos et al.
6,720,763 B1 4/2004 Nehl et al.
7,170,279 B2 1/2007 Haas et al.
(Continued)

FOREIGN PATENT DOCUMENTS

DE 102009038256 A1 4/2010

OTHER PUBLICATIONS

"The Vernier Scale", The Geometry of Surveying, Jan. 26, 2012, p. 1-3.
(Continued)

Primary Examiner — Reena Aurora
(74) Attorney, Agent, or Firm — Eschweiler & Associates, LLC (57) ABSTRACT The present disclosure relates to a magnetic angle sensor module having first magnetic polewheel comprising a first number of poles and a second magnetic polewheel comprising a second number of poles greater than the first number. First and second magneto-resistive sensors are located around the first polewheel at a first angular position and a second angular position, respectively. The first and second magneto-resistive sensors collectively generate sensor signals corresponding to a measured angle of the first polewheel, while the third magneto-resistive sensor generates a third sensor signal corresponding to a measured angle of the second polewheel. A signal processor receives the first and third sensor signals and operates an algorithm that determines a position within a signal curve of the second polewheel from the first sensor signal and that determines an enhanced angle from the position within the signal curve and the third sensor signal.

17 Claims, 9 Drawing Sheets (51) Int. Cl.
*G01D 5/14* (2006.01)
*G01D 5/244* (2006.01)

(56) References Cited

U.S. PATENT DOCUMENTS

| | | | |
|---|---|---|---|
| 7,714,570 B2 | 5/2010 | Thomas et al. | |
| 8,085,036 B2 | 12/2011 | Ausserlechner | |
| 8,115,479 B2 | 2/2012 | Aimuta et al. | |
| 8,952,683 B2 * | 2/2015 | Granig et al. | 324/207.21 |
| 2005/0127899 A1 | 6/2005 | Kakuta et al. | |

OTHER PUBLICATIONS

"Sensors and Actuators", The Learning Place for Sensors and Actuators, Jul. 25, 2012, p. 1-4.

Frachon, et al., "Absolute Magnetic Sensors for Large Diameter Through-Shaft Applications", Moving Magnet Technologies SA, p. 1-5, Jul. 2012.

"Magnetic Sensors Giant Magneto Resistors", www.infineon.com/products/sensors, Edition 07.01, 2001, p. 1-19.

Bartos, Axel; "Measurement Specialties: Absolute Angular Positioning Utilizing Magnetoresistive Sensors", 2008, 1-74.

"Sensitec Application Note"; Application Note AA700.AND.00; Sensitec GmbH; www.sensitec.com; Apr. 2009, p. 1.

Non-Final Office Action dated Jun. 20, 2014 in connection with U.S. Appl. No. 13/557,571.

Notice of Allowance dated Sep. 30, 2014 in connection with U.S. Appl. No. 13/557,571.

* cited by examiner

MAGNETIC OUT-OF-AXIS ANGLE SENSING PRINCIPLE

CROSS REFERENCE TO RELATED APPLICATIONS

This application is a Continuation patent application of U.S. patent application Ser. No. 13/557,571 filed on Jul. 25, 2012 in the name of Wolfgang Granig, et al. and is here by incorporated in its entirety.

BACKGROUND

Magnetic polewheels are used in many modern day angular position sensors to detect the angular position of a rotating object. Such angular position sensors have applications in many fields such as automotive, industrial, etc. For example, in automobiles angular position sensors are used in brushless direct current (BLDC) motors to detect rotor position during operation and in steering angle measurement to provide information about the direction a driver wants to go for automatic steering applications (e.g., electric power steering, electronic stability control, active steering systems, parking assistance systems, etc.).

Conventional magnetic angular position sensors are positioned in front of a rotating magnetized disc located at the end of a shaft. In such a position, the magnetic angular position sensors are able to accurately measure changes in the magnetic field and to determine an angle of the shaft therefrom. However, if the end of the shaft is not accessible due to mechanical restrictions (e.g., in electrical car motors), the magnetic angular position sensor is instead located alongside the shaft at a position outside of an axis of rotation (i.e., an out-of-axis position). In such an out-of-axis position, the out-of-axis magnetic angular position sensor measures changes in an out-of-axis magnetic field and determines an angle of the shaft therefrom.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 1A:
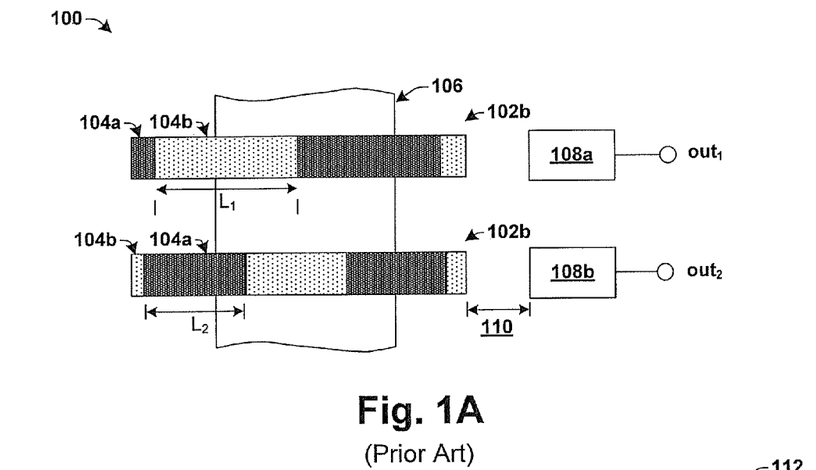
FIG. 1A illustrates a block diagram of an out-of-axis magnetic sensor module configured to detect an out-of-axis magnetic field according to the Nonius principle.

Some conventional methods for measuring a mechanical angle of rotation by way of out-of-axis magnetic fields use the Nonius principle (i.e., the Vernier principle). The Nonius principle allows shaft angle detection over a mechanical 360° rotation by combining signal information received from two sensors triggered by two polewheels. For example, FIG. 1A illustrates a block diagram of an out-of-axis magnetic sensor module 100 configured to detect an out-of-axis magnetic field using the Nonius principle. The magnetic sensor module 100 comprises a primary polewheel 102a and a secondary polewheel 102b mounted on a rotatable shaft 106 and separated from magnetic field sensors 108 by an air gap 110. The primary and secondary polewheels, 102a and 102b, comprise concentric ring structures with a plurality of sections 104 having alternating outward polarities (e.g., "north magnetic poles" 104a and "south magnetic poles" 104b). The primary and secondary polewheels, 102a and 102b, have a same geometric dimension, but a different number of pole pairs, so that the sections of the primary polewheel 102a have a larger size than the sections of the secondary polewheel 102b (i.e., $L_1 > L_2$).

Figure 1B:
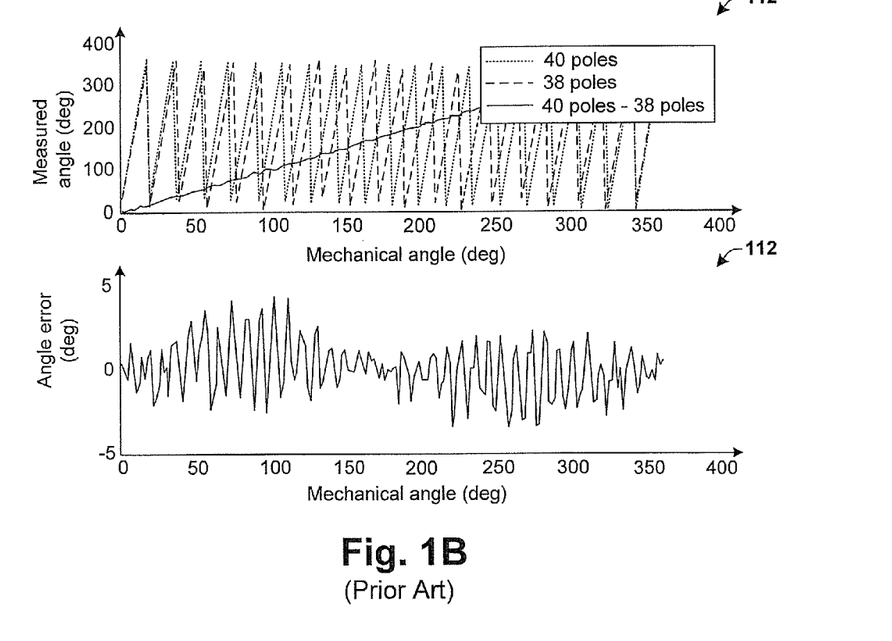
FIG. 1B illustrates graphs showing an angle detected by the out-of-axis magnetic sensor of FIG. 1A and an associated error.

As the rotatable shaft 106 rotates magnetic polewheels 102a and 102b rotate, causing sections 104a and 104b to move past the magnetic field sensors 108. A first magnetic field sensor 108a detects changes in a magnetic field generated by the primary polewheel 102a, and therefrom generates a first output signal $out_1$. A second magnetic field sensor 108b detects changes in a magnetic field generated by the secondary polewheel 102b, and therefrom generates a second output signal $out_2$. A Nonius angle (i.e., an estimated mechanical) of the rotating shaft 106, as shown in graph 112 of FIG. 1B, is determined based upon a difference of measured angles corresponding to the first output signal $out_1$ and an angle corresponding to the second output signal $out_2$.

Using the Nonius principle improves the sensitivity of polewheel based magnetic sensor modules over sensor modules using a single polewheel (e.g., which can have errors as high as +/−35° for diametric polewheels). For example, graph 112 shows an error associated with the Nonius angle (y-axis) as a function of the actual, mechanical angle (x-axis). As shown in graph 112, the error of the Nonius angle ranges from +4.23°/−3.50°. However, even using the Nonius principle, detection errors can arise.

Accordingly, some aspects of the present disclosure provide for a method and/or apparatus for accurately measuring an out-of-axis magnetic field generated by a magnetic polewheel.

In some embodiments, the disclosure relates to a magnetic sensor module having a first polewheel comprising a plurality of sections, having alternating magnetic polarities, positioned around a circumference of a ring structure. A first magneto-resistive sensor is located at a first angular position. A second magneto-resistive sensor is located at a second angular position. The second magneto-resistive sensor is oriented with respect to a radial direction of the magnetic polewheel at a non-zero angle dependent upon a number of the plurality of sections. The first and second magneto-resistive sensors are configured to concurrently generate first and second sensor signals proportional to a magnetic field corresponding to a first measured angle of the first polewheel. A signal processor is configured to receive the first and second sensor signals and to determine an estimated mechanical angle of the first polewheel to a high degree of accuracy therefrom.

In other embodiments, the disclosure relates to a method of measuring an enhanced angle corresponding to a mechanical angle of a rotatable device by determining an out-of-axis magnetic field based upon a signal period of a detected signal. The method comprises operating one or more magnetic field sensors to determine a position within a signal curve corresponding to a mechanical rotation. The position is then translated into a signal period of the position measured by the one or more magnetic field sensors. An enhanced angle is then calculated from the signal period. By determining the enhanced angle from a signal period, the accuracy of the enhanced angle can better estimate the actual mechanical angle of the rotatable device.

Figure 2:
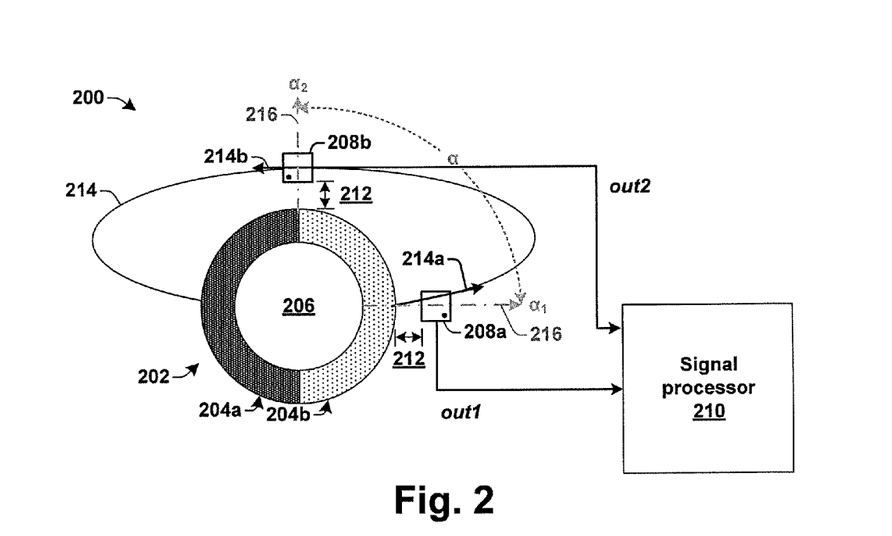
FIG. 2 a block diagram of some embodiments of a multi-sensor magnetic sensor module configured to measure a magnetic field at an out-of-axis position.

FIG. 2 illustrates a block diagram of some embodiments of a multi-sensor magnetic sensor module 200 configured to measure an estimated mechanical angle of a magnetic polewheel based upon a magnetic field measured at an out-of-axis position.

The multi-sensor magnetic sensor module 200 comprises a magnetic polewheel 202 with a plurality of sections 204 (i.e., "poles") configured to generate magnetic fields having alternating polarities around a ring structure. For example, a first section 204a is configured to generate a magnetic field having a first polarity (e.g., having a north magnetic pole facing radially outward), while a second section 204b is configured to generate a magnetic field having a second polarity (e.g., having a south magnetic pole facing radially outward). The alternating polarities of the first and second sections, 204a and 204b, result in a magnetic field that varies as a function of an angle of the magnetic polewheel 202. Although multi-sensor magnetic sensor module 200 is illustrated as having two sections (poles), it will be appreciated that the disclosed multi-sensor magnetic sensor module may comprise any number of sections.

The magnetic polewheel 202 is mounted on a rotatable shaft 206 and is separated by an air gap 212 from a first magneto-resistive sensor 208a and from a second magneto-resistive sensor 208b. The first and second magneto-resistive sensors, 208a and 208b, are configured to detect a magnetic field 214 output from the magnetic polewheel 202 and to respectively generate first and second output signals, out1 and out2, based upon the detected magnetic field 214. The first and second output signals correspond to an estimated mechanical angle of the magnetic polewheel 202. In some embodiments, the first and second magneto-resistive sensors comprise giant magneto-resistive sensors.

As the rotatable shaft 206 rotates the magnetic polewheel 202 rotates, causing sections 204a and 204b to move past the magnetic field sensors 208. Since the magnetic field 214 generated by the magnetic polewheel 202 varies as a function of angle, the resulting output signals, out1 and out2, generated by the magnetic field sensor 208 comprise a sinusoidal signal with a signal period that is dependent upon a number of sections 204 in the magnetic polewheel 202. The first and second output signals $out_1$ and $out_2$ are provided to a signal processor 210. The signal processor 210 operates an algorithm to determine a first measured angle of the first magneto-resistive sensor 208a and a second measured angle of the second magneto-resistive sensor 208b. The first and second measured angles are then averaged to generate an estimated mechanical angle of the magnetic polewheel 202. In some embodiments, the algorithm corresponds to the methods 700 and 800, described below.

The first magneto-resistive sensor 208a is located at a first angular position $\alpha_1$ and the second magneto-resistive sensor 208b is located at a second angular position $\alpha_2$. The first and second angular positions, $\alpha_1$ and $\alpha_2$, are separated by a separation angle $\Delta\alpha$, which is dependent upon a number of pole pairs present in the magnetic polewheel 202. The separation angle $\Delta\alpha$ causes the first magneto-resistive sensor 208a to be located at a position that correspond to a center of a magnetic pole (e.g., 204b), when the second magneto-resistive sensor 208b is located at a position that corresponds to a magnetic pole transition (e.g., a transition between 204b and 204a). Since the error of a magnetic sensor is small when a sensor is facing a middle of a pole or a pole transition (i.e., the magneto-resistive sensors have a high degree of accuracy at a center of a pole and at a pole transition, where the magnetic field is substantially straight), such a separation can improve the accuracy of the magnetic sensor module 200.

The first and second magneto-resistive sensors 208a, 208b are configured to measure a magnetic field generated by a same section of the magnetic polewheel 202 at a same time. In some embodiments, the first and second magneto-resistive sensors, 208a and 208b, are oriented at different angles with respect to a radial direction 216 of the polewheel. Because of the directional dependence of the magneto-resistive sensors 208 (e.g., magneto-resistive sensors have a resistance that is proportional to an angle at which a magnetic field is incident on the magneto-resistive sensor), such an orientation allows for the first and second magneto-resistive sensors, 208a and 208b, to be oriented in line with a magnetic field line generated by a same section of the magnetic polewheel 202, such that the first and second magneto-resistive sensors, 208a and 208b, measure a same mechanical angle of the magnetic polewheel 202 at a time.

For example, for the diametric magnetic polewheel 202 of FIG. 2, wherein an angular separation of 90° causes a first magneto-resistive sensor 208a to be located at a center of a magnetic pole when the second sensor is located at a transition between sections (i.e., magnetic poles), the first magneto-resistive sensor 208a is oriented at 0° with respect to the radial direction 216 of the magnetic polewheel 202 while the second magneto-resistive sensor 208b is oriented at 180° with respect to the radial direction 216 of the magnetic polewheel 202. Such an orientation allows for the second magneto-resistive sensor 208b to measure a same estimated mechanical angle as the first magneto-resistive sensor 208a.

Figure 3:
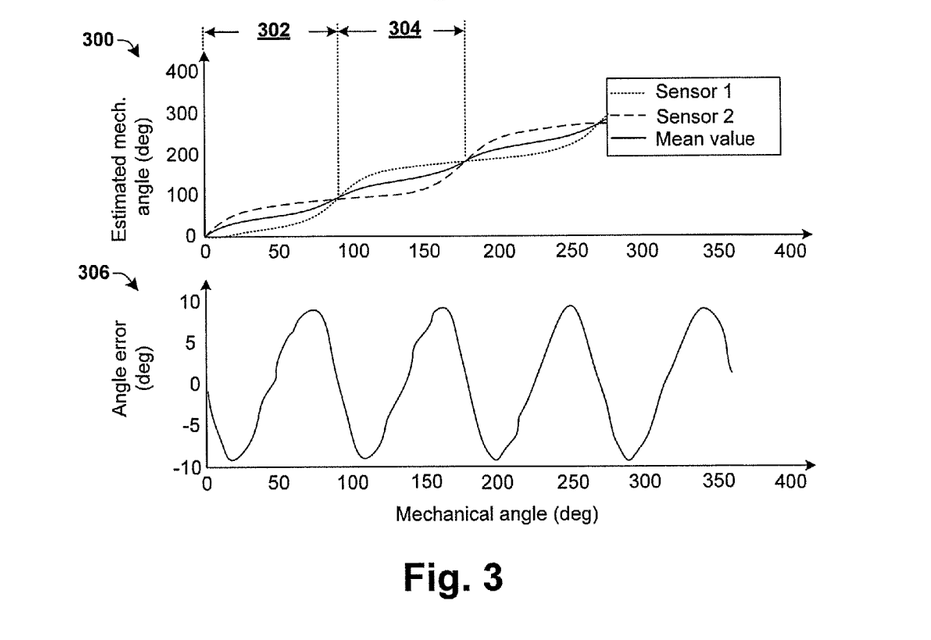
FIG. 3 illustrates graphs showing an angle detected by the out-of-axis magnetic sensor of FIG. 2 and an associated error.

FIG. 3 illustrates graphs 300, 306 showing estimated mechanical angles measured by a disclosed multi-sensor magnetic sensor module (e.g., multi-sensor magnetic sensor module 200) and an associated error. Graph 300 shows the estimated mechanical angle (y-axis) as a function of an actual, mechanical angle (x-axis) of a rotatable device. Graph 306 shows an error associated with the estimated mechanical angle (y-axis) as a function of the actual, mechanical angle (x-axis).

As shown in graph 300, in a first region 302 (where a first sensor travels from a pole center to a pole transition and the second sensor travels from a pole transition to a pole center) the first measured angle has a negative error, so that the first measured angle is less than the actual mechanical angle. Furthermore, the second measured angle has a positive error so that the measured angle is greater than the actual mechanical angle. Taking the average (i.e., mean) of the first and second measured angles in the first region 302 causes the positive and negative error values to cancel each other, resulting in an estimated mechanical angle having a reduced overall error.

In a second region 304 (where the first sensor travels from a pole center to a pole transition and the second sensor travels from a pole transition to a pole center) the first measured angle has a negative error, so that the first measured angle is less than the actual mechanical angle. Furthermore, the second measured angle has a positive error, so that the second measured angle is greater than the actual mechanical angle. Taking the average (i.e., mean) of the first and second measured angles in the second region 304 causes the positive and negative error values to cancel each other, resulting in an estimated mechanical angle having a reduced overall error. The resulting error shown in graph 306 is between +/−9.4°.

Figure 4A:
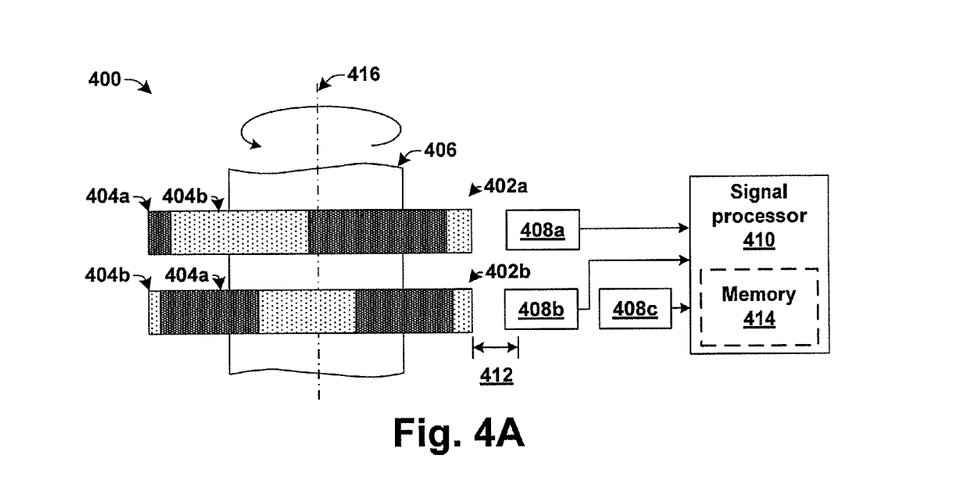
FIGS. 4A-4B illustrates some alternative embodiments of a multi-sensor magnetic sensor module configured to measure a magnetic field at an out-of-axis position.
Figure 4B:
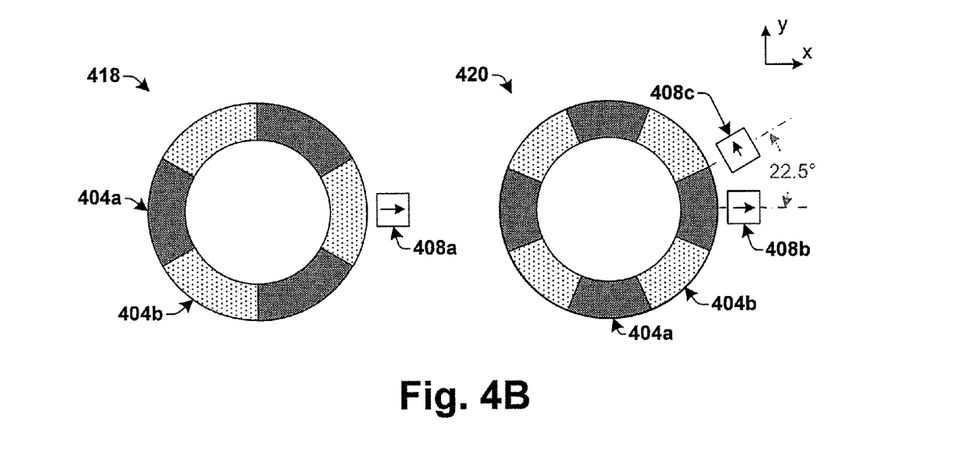

FIGS. 4A-4B illustrate some alternative embodiments of a multi-sensor magnetic sensor module 400 configured to measure a magnetic field at an out-of axis position.

The multi-sensor magnetic sensor module 400 comprises two polewheels: a primary polewheel 402a (i.e., a coarse polewheel) having n pole pairs and a secondary polewheel 402b (i.e., a fine polewheel) having n+1 pole pairs. As shown in FIG. 4A-4B, the primary polewheel has 3 pole pairs (i.e., 6 poles) while the secondary polewheel has 4 pole pairs (i.e., 8 poles). The primary and secondary polewheels, 402a and 402b, are mounted on a rotatable shaft 406 configured to rotate about an axis of rotation 416 that extends through an origin of the primary and secondary polewheels, 402a and 402b. Respective polewheels have ring structures with a plurality of a sections 404 (poles) having different magnetic polarities such that the outer surface of the polewheels 402 alternate between sections having a north magnetic pole 404a and sections having a south magnetic pole 404b. In some embodiments, the sections 404 may be formed by a magnetic material such as Hartferrit.

The polewheels, 402a and 402b, are separated from magnetic field sensors 408 by an air gap 412. In particular, a first magneto-resistive sensor 408a is associated with the primary magnetic polewheel 402a, while a second magneto-resistive sensor 408b and a third magneto-resistive sensor 408c are associated with the secondary polewheel 402b. The magnetic field sensors 408a-408c are configured to provide signals to a signal processor 410 configured to measure a mechanical angle of the rotating shaft 406. In some embodiments, the signal processor 410 comprises a memory element 414 configured to store an algorithm (e.g., algorithms corresponding to methods 600 or 700) that is used in processing the signals received from the magnetic field sensors 408 to determine an estimated mechanical angle.

FIG. 4B illustrates top views 418, 420 of the primary polewheel 402a and the second polewheel 402b in magnetic sensor module 400. Top view 418 illustrates the first magneto-resistive sensor 408a located at a first angular position around a perimeter of the primary polewheel 402a. Top view 420 further illustrates the second magneto-resistive sensor 408b and the third magneto-resistive sensor 408c, respectively located at second and third angular positions around a perimeter of the second polewheel 402b. The second angular position and the third angular position are separated by a separation angle of 22.5°, which causes the second magneto-resistive sensor 408b to be located at a position that corresponds to a center of a section 404 of the second polewheel 402b when the third magneto-resistive sensor 408c sensor is located at a position that corresponds to a transition between sections 404 of the second polewheel 402b. By placing the two magneto-resistive sensors 408a, 408b in positions that concurrently measure a magnetic field of the second polewheel 402b, the estimated mechanical angle of the second polewheel can be improved.

Figure 5:
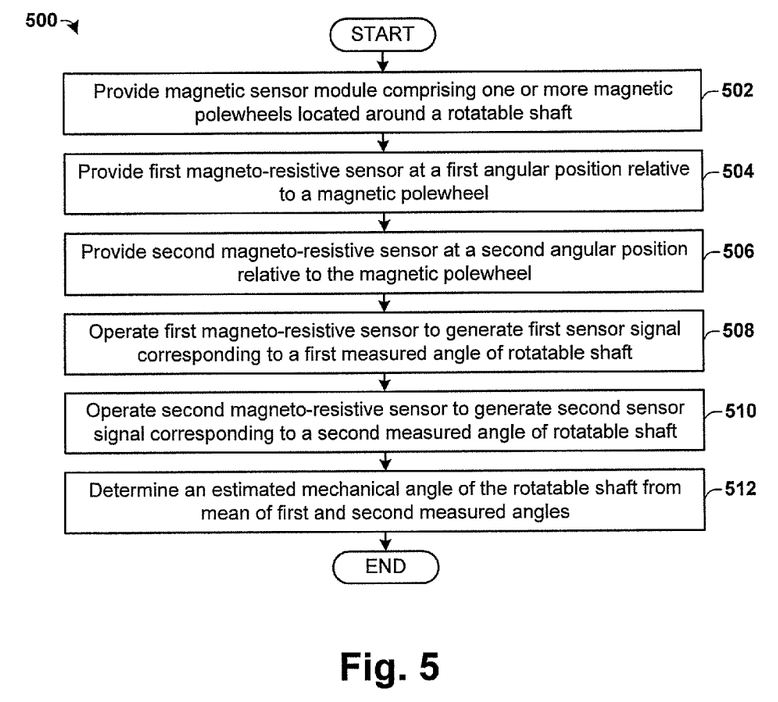
FIG. 5 is a flow diagram of some embodiments of a method for forming a multi-sensor out-of-axis magnetic field module.

FIG. 5 is a flow diagram of some embodiments of a method 600 for forming a multi-sensor out-of-axis magnetic field module.

At 502, a magnetic sensor module comprising one or more magnetic polewheel located around a rotatable shaft is provided. The magnetic polewheels comprises a plurality of a sections ("poles") having different magnetic polarities, such that the outer surface of the polewheel alternates between sections having a north magnetic pole and sections having a south magnetic pole.

At 504, a first magneto-resistive sensor is provided at a first angular position relative to a magnetic polewheel.

At 506, a second magneto-resistive sensor is provided at a second angular position relative to the magnetic polewheel. In general, for a polewheel having n poles (i.e., sections), the first and second magneto-resistive sensors are separated by a separation angle $\Delta\alpha$, where:

$$\Delta\alpha = 360°/2n.$$

Furthermore, the second magneto-resistive sensor is oriented with respect to the first magneto-resistive sensor by a rotation angle of $\beta$, where:

$$\beta = 90° + 360°/2n.$$

Such an orientation between the first and second magneto-resistive sensors causes the magneto-resistive sensors to be oriented at different angles with respect to a radial direction of the magnetic polewheel.

At 508, the first magneto-resistive sensor is operated to generate a first sensor signal corresponding to a first measured angle $\phi_1$. The first measured angle $\phi_1$ is the first magneto-resistive sensor's measurement of a mechanical angle of the rotatable shaft. However, due to errors in the measurement, the first measured angle $\phi_1$ may deviate slightly from the actual mechanical angle $\phi_{mech}$.

At 510, the second magneto-resistive sensor is operated to generate a second sensor signal corresponding to a second measured angle $\phi_2$. The second measured angle $\phi_1$ is the second magneto-resistive sensors measurement of a mechanical angle of the rotatable shaft. However, due to errors in the measurement, the second measured angle $\phi_2$ may deviate slightly from the actual mechanical angle $\phi_{mech}$.

At 512, an estimated mechanical angle $\phi_{est}$ of the rotatable shaft is determined from the mean of the first and second measured angles, $$\phi_{est} = (\phi_1 + \phi_2)/2.$$

By determining the estimated mechanical angle $\phi_{est}$ from the mean of the first and second measured angles, the errors associated with the first and second measured angles, $\phi_1$ and $\phi_2$, are mitigated providing for a good accuracy of the resulting multi-sensor magnetic sensor module.

Figure 6:
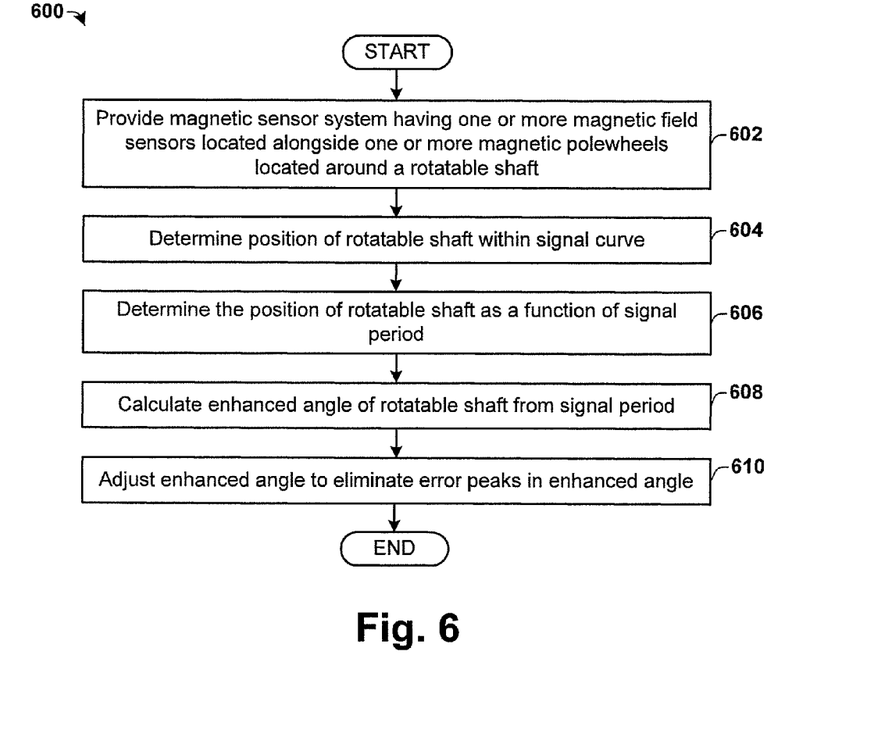
FIG. 6 is a flow diagram of some embodiments of a disclosed method for accurately measuring a magnetic field at an out-of-axis position.
Figure 7:
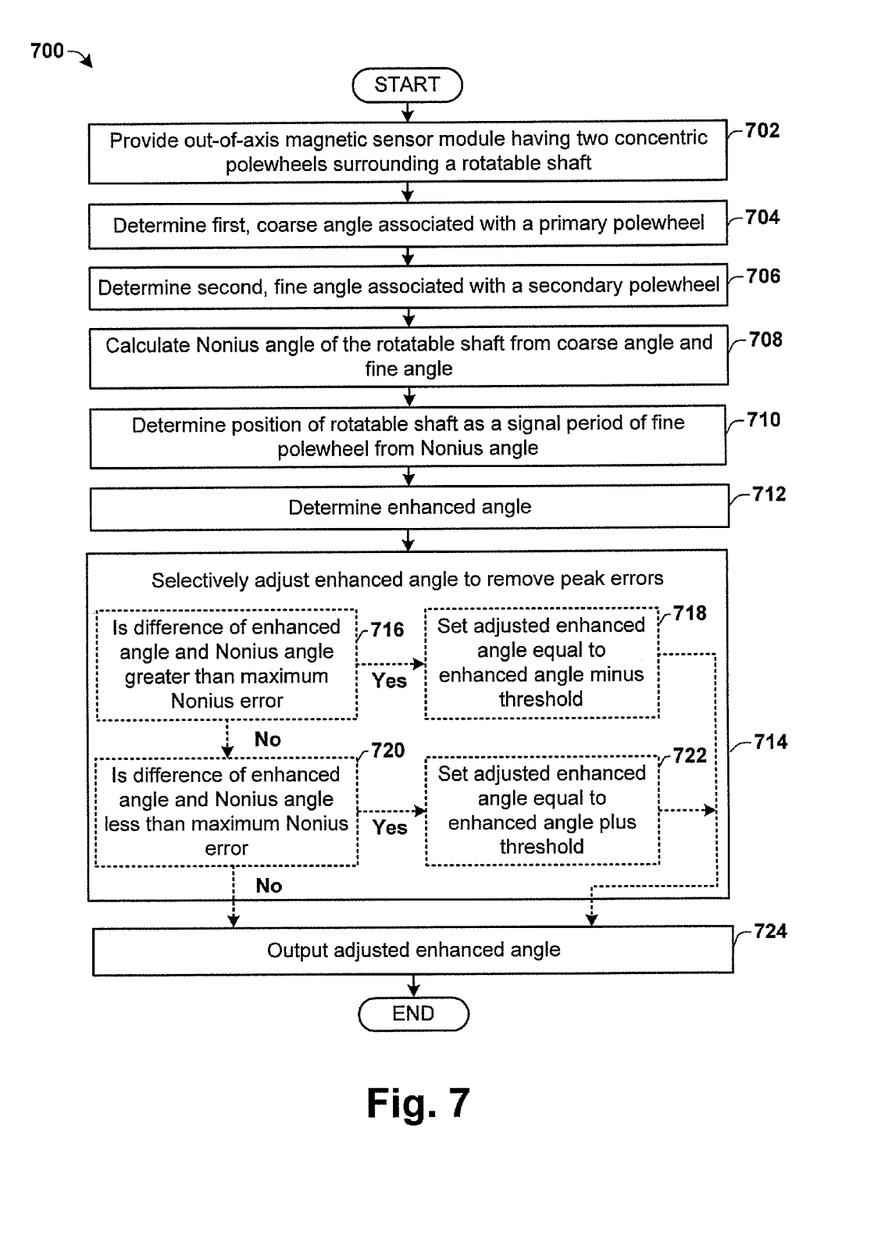
FIG. 7 is a flow diagram of a more detailed embodiment of a disclosed method for accurately measuring a magnetic field at an out-of-axis position using an improved Nonius principle.

FIGS. 6-7 illustrate flow diagrams of some embodiments of methods, 600 and 700, of measure an enhanced estimated mechanical angle (i.e., an enhanced angle) of a polewheel by counting an actual signal period of a position of a polewheel measured one or more out-of-axis magnetic field sensors. By determining an enhanced angle from an actual signal period, the accuracy of the resulting enhanced angle can be further improved.

FIG. 6 illustrates a flow diagram of some embodiments of a disclosed method 600 for measuring an enhanced angle of a rotatable device based upon signal period.

At 602, an out-of-axis magnetic field sensor module is provided. The out-of-axis magnetic field sensor module comprises one or more magnetic field sensors located alongside one or more rotating magnetic polewheels located around a rotatable shaft. The one or more magnetic field sensors are configured to measure components of a magnetic field generated by a magnetic polewheel. In some embodiments, the one or more magnetic field sensors comprise magneto-resistive sensors (e.g., giant magneto-resistive sensors). In some embodiments, the out-of-axis magnetic field sensor module comprises two concentric rotating polewheels, wherein respective polewheels comprise one or more magnetic field sensors located alongside the polewheels.

At 604, at least one magnetic field sensor is operated to determine a position of the rotatable shaft within a signal curve. In some embodiments, the position of the rotatable shaft within the signal curve is determined as a function of a measured angle. For example, a position of the rotatable shaft within a signal curve that extends over a mechanical 360° rotation may comprise a measured angle determined by translating a sensor signal generated by a magnetic sensor to the measured angle. In some embodiments, the position of the rotatable shaft within the signal curve comprises a Nonius angle (i.e., a measured angle determined by utilizing the Nonius principle), in which the Nonius angle is proportional to a difference between a first measured angle generated by a first magnetic sensor associated with a first polewheel and a second measured angle generated by a second magnetic sensor associated with a second polewheel.

At 606, the position of the rotatable shaft within a signal curve is translated to a signal period. The signal period is an amount of time that a signal takes to go through one complete iteration. In a polewheel having multiple sections/poles, the signal output from a magnetic sensor will go through multiple signal periods over a mechanical 360° rotation. For example, a polewheel having n pole pairs (i.e., wherein each pole pair has two sections) will go through n signal periods over a mechanical 360° rotation. In some embodiments, a Nonius angle of a polewheel (determined at 604) can be translated into a signal period, thereby allowing the position of the rotatable shaft within the signal curve to be a function of a signal period rather than an angle. For example, for a polewheel having two polewheel pairs, a Nonius angle of 180° would translate to a signal period of 1.

At 608, an enhanced angle of the rotatable shaft is calculated from the signal period. The enhanced angle is an estimated of the physical angular position of the rotatable shaft.

At 610, the enhanced angle may be adjusted to eliminate error peaks. In some embodiments, the enhanced angle can be adjusted to eliminate errors inherent in the Nonius angle from which the signal period is determined. For example, if the enhanced angle is calculated based upon a signal period determined from a Nonius angle, errors in the Nonius angle can cause the signal period to be incorrect, resulting in error peaks in the enhanced angle. Therefore, by comparing the enhanced angle to a maximum error of the Nonius angle, the error peaks can be identified and subsequently corrected.

FIG. 7 is a flow diagram of some embodiments of a more detailed method 700 for accurately measuring a magnetic field at an out-of-axis position using an improved Nonius principle. Unlike the conventional Nonius principle calculations, which calculates an estimated mechanical angle from a phase difference between angles measured from concentric polewheels, the disclosed method 800 calculates an enhanced estimated mechanical angle from a signal period.

While the disclosed methods (e.g., method 600, 700, and 800) are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, an out-of-axis magnetic sensor module having two concentric polewheels is provided. In some embodiments, the out-of-axis magnetic field sensor module comprises a first magnetic sensor associated with a primary polewheel and a second magnetic sensor associated with a secondary polewheel. The primary polewheel has a first number of sections/poles (e.g., n pole pairs). The secondary polewheel is positioned concentric to the primary polewheel and has a second number of sections poles, which is greater than the first number of sections/poles (e.g., n+1 pole pairs).

Figure 8:
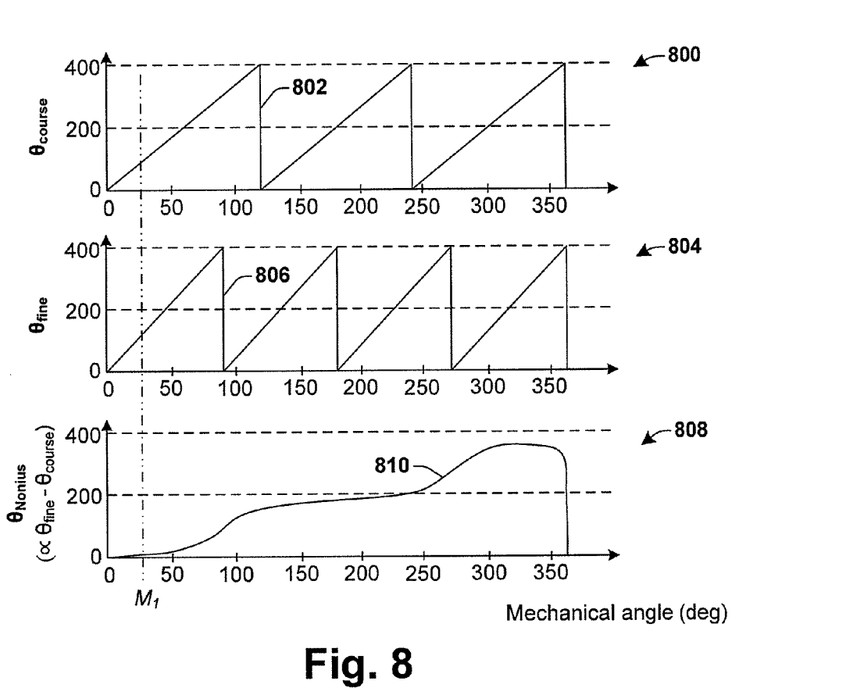
FIG. 8 illustrates graphs showing exemplary angles measured during the method of FIG. 7.

At 704, a first, course angle ($\theta_{coarse}$) associated with the primary polewheel is determined. FIG. 8 illustrates a graph 800 showing an exemplary coarse angle $\theta_{coarse}$ associated with a primary polewheel having three pole pairs. The coarse angle $\theta_{coarse}$ follows a trend line 802 that goes from 0° to 360° over a period spanning a mechanical angle of 120°. Since there are three pole pairs, the resulting coarse angle goes from 0° to 360° three times over a mechanical angle of 360°.

At 706, a second, fine angle ($\theta_{fine}$) associated with the secondary polewheel is determined. FIG. 8 illustrates a graph 804 showing an exemplary fine angle $\theta_{fine}$ associated with a secondary polewheel having four pole pairs. The fine angle $\theta_{fine}$ follows a trend line 806 that goes from 0° to 360° over a period spanning a mechanical angle of 90°. Since there are four pole pairs, the resulting fine angle goes from 0° to 360° four times over a mechanical angle of 360°. In some embodiments, the fine angle $\theta_{fine}$ is determined from a first measured signal generated by a first magneto resistive sensor and a second measured signal generated by a second magneto-resistive sensor, as described in relation to FIG. 2.

At 708, a Nonius angle ($\theta_{Nonius}$) of the rotatable shaft is determined from the coarse angle $\theta_{coarse}$ and the fine angle $\theta_{line}$. The Nonius angle $\theta_{Nonius}$ is an approximate mechanical angle of the rotatable shaft as measured by the fine polewheel. The Nonius angle $\theta_{Nonius}$ can be determined according to the Nonius principle, in which the coarse angle $\theta_{coarse}$ is subtracted from the fine angle $\theta_{fine}$ to generate a Nonius angle $_{Nonius}$ of the fine polewheel (i.e., $\theta_{Nonius}=\theta_{fine}-\theta_{coarse}$) that provides a rough estimate of the mechanical angle of the rotatable shaft. In some embodiments, the modulo of the Nonius angle $\theta_{Nonius}$ and 360° is taken to correct overshoots in the Nonius angle $\theta_{Nonius}$. In such embodiments, the resulting Nonius angle $\theta_{Nonius}$ is equal to:

$$\theta_{Nonius}=\text{mod}(\theta_{Nonius}',360°)$$

where $\theta_{Nonius}'=\theta_{fine}-\theta_{coarse}$. For negative difference between fine angle $\theta_{fine}$ and the coarse angle $\theta_{coarse}$, the modulo is defined as: mod (-x, 360°)=360°-x (e.g., mod(-35°, 360°)=325° C.).

FIG. 8 illustrates a graph 808 showing a Nonius angle $\theta_{Nonius}$. The Nonius angle $\theta_{Nonius}$ has a value that follows a trend line 810 and that is proportional to a difference between the fine angle $\theta_{fine}$ and the coarse angle $\theta_{coarse}$. For example, at a first mechanical angle M₁, the course angle $\theta_{coarse}$ is equal to approximately 100° while the fine angle $\theta_{fine}$ is equal to approximately 135°, resulting in a Nonius angle $\theta_{Nonius}$ of 35°. The modulo of 35° and 360° provides a Nonius angle $\theta_{Nonius}$ of 35°. The Nonius angle $\theta_{Nonius}$ typically has an error of approximately +4°/−3.5° degrees.

At 710, a position of the rotatable shaft is determined as a function of a signal period of the fine polewheel. In some embodiments, the signal period is determined by first calculating a threshold, which is equal to a size of a signal period of the fine polewheel in degrees, and then dividing the measured angle by the threshold. In such an embodiment, the threshold is equal to three-hundred and sixty degrees divided a number of pole pairs of a fine pole wheel (i.e., Threshold=360°/pole pair number of fine wheel). The signal period is equal to the floor of the Nonius angle $\theta_{Nonius}$ divided by the threshold (i.e., Signalperiod Number=Floor($\theta_{Nonius}$/Threshold), wherein the floor function of x rounds the elements of x to the nearest integer less than or equal to x.

For example, a fine polewheel having 4 polewheel pairs has a threshold of 360°/4=90°. Therefore, a Nonius angle $\theta_{Nonius}$ of approximately 10° will result in a signal period of 0 (i.e., Floor (10°/90)) indicating that the Nonius angle $\theta_{Nonius}$ is within the first signal period of the fine polewheel, while a Nonius angle $\theta_{Nonius}$ of approximately 120° will result in a signal period of 1 (i.e., Floor (120°/90)) indicating that the Nonius angle $\theta_{Nonius}$ is within the second signal period of the fine polewheel.

At 712, an enhanced angle is determined. The enhanced angle is calculated based upon the signal period and the fine angle $\theta_{fine}$. In some embodiments, the enhanced angle $\theta_{enhanced}$ is equal to:

$$\theta_{enhanced}=(360°*\text{Signalperiod Number}+\theta_{fine})/\text{pole number of fine wheel}.$$

For example, for a fine polewheel having 4 poles pairs, a signal period of 1, and a fine angle of 35°, the enhanced angle $\theta_{enhanced}$ is equal to 395°/4=98.75°.

At 714, the enhanced angle is selectively adjusted to remove peak errors. Since the Nonius angle is sometimes erroneous, the correct signal period cannot always be determined correctly causing the calculated signal period to be off by one. This results in error peaks in the enhanced angle with an amplitude that is equal to the threshold. To account for such peak errors, the peak errors are first identified and then the enhanced angle is adjusted by a value equal to the threshold.

For example, in one embodiment, to account for the error peaks, the enhanced angle $\theta_{enhanced}$ is compared with the Nonius angle $\theta_{Nonius}$. If the difference of the enhanced angle $\theta_{enhanced}$ and the Nonius angle $\theta_{Nonius}$ is greater than a maximum error of the Nonius angle (i.e., a "Nonius error") (act 716), the method assumes that a positive error peak is present and generates an adjusted enhanced angle $\theta_{enhanced}'$ that is equal to the enhanced angle $\theta_{enhanced}$ minus the threshold (act 718). If the difference of the enhanced angle $\theta_{enhanced}$ and the Nonius angle $\theta_{Nonius}$ is less than a minimum Nonius error (act 720), the method assumes that a negative error peak is present and generates an adjusted enhanced angle $\theta_{enhanced}'$ that is equal to the enhanced angle $\theta_{enhanced}$ plus the threshold (act 722). If the difference of the enhanced angle $\theta_{enhanced}$ and the Nonius angle $\theta_{Nonius}$ is less than a maximum Nonius error or greater than a minimum Nonius error, no peak is present and the enhanced angle $\theta_{enhanced}$ is not adjusted. In summary, the enhanced angle $\theta_{enhanced}$ can be adjusted according to the following equations:

IF $\theta_{Nonius}-\theta_{enhanced}>\text{max}(\text{abs}(\text{Error}_{Nonius}))$ $\theta_{enhanced}'=\theta_{enhanced}-\text{Threshold}$ IF $\theta_{Nonius}-\theta_{enhanced}<-\text{max}(\text{abs}(\text{Error}_{Nonius}))$ $\theta_{enhanced}'=\theta_{enhanced}+\text{Threshold}$.

In some embodiments, methods 600 and 700 may be executed by the disclosed multi-sensor magnetic field modules (e.g., multi-sensor magnetic sensor module 200 and 500). However, it will be appreciated that methods 600 and 700 are not limited to such multi-sensor magnetic field modules. Rather, the disclosed methods may be applied independent of the disclosed multi-sensor magnetic field modules or in conjunction with the disclosed multi-sensor magnetic field modules.

Figure 9A:
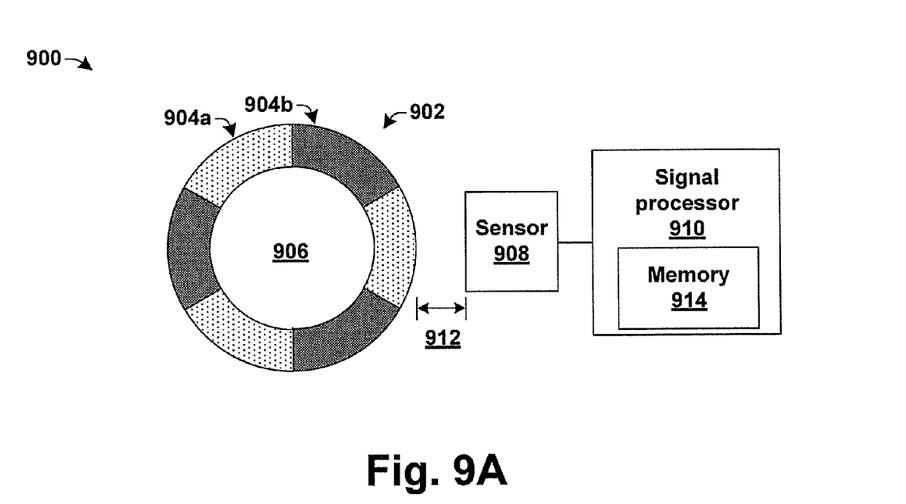
FIG. 9A illustrates a block diagram of some embodiments of a magnetic sensor module configured to implement a disclosed method of measuring a magnetic field at an out-of-axis position.

For example, FIG. 9A illustrates a block diagram of some embodiments of a single sensor magnetic sensor module 900 configured to implement a method of measuring a magnetic field at an out-of-axis position (e.g., method 600).

The magnetic sensor module 900 comprises a polewheel 902 mounted on a rotatable shaft 906 and separated by an air gap 912 from one or more magnetic field sensors 908 configured to detect a magnetic field output from the polewheel 902. The polewheel 902 comprises with a plurality of sections 904 configured to generate magnetic fields having alternating polarities around a ring structure.

Based upon a detected magnetic field, the magnetic field sensors 908 are configured to generate one or more output signals, corresponding to a magnetic field generated by the polewheel 902, which are provided to a signal processor 910. The signal processor 910 comprises a memory element 914 configured to store an algorithm that determines a signal period corresponding to the output signals generated by the magnetic field sensors 908.

Figure 9B:
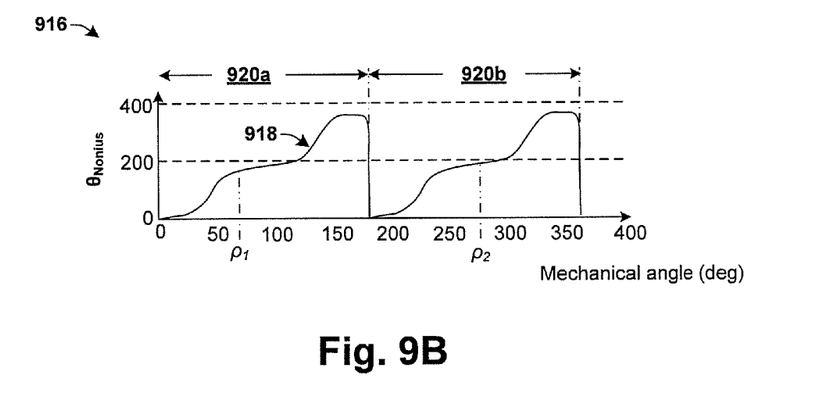
FIG. 9B illustrates a graph showing an angle measured by the out-of-axis magnetic sensor module of FIG. 9A.

For example, graph 916 of FIG. 9B illustrates an exemplary trendline 918 showing a Nonius angle measured by the signal processor 910 based upon the output signals. In some embodiments, the signal processor 910 operates the algorithm stored in memory element 914 to determine a signal period from the angle of trendline 918. For example, an angle ρ1 corresponds to a first signal period 918a, while an angle ρ2 corresponds to a second signal period 918b. Based upon determined signal period, the signal processor 910 executes the algorithm to determine an enhanced angle and/or an adjusted enhanced angle of the rotatable shaft 906 based upon the signal period.

Figure 10A:
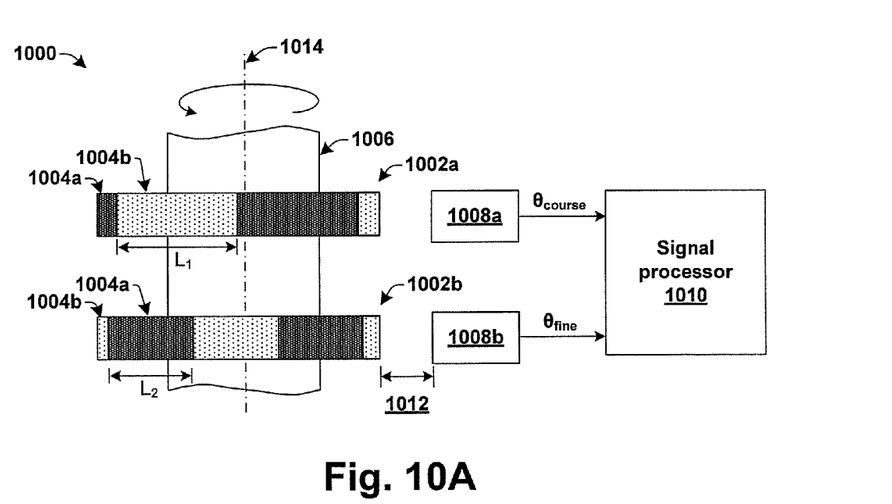
FIG. 10A illustrates a block diagram of some additional embodiments of a magnetic sensor module configured to implement the method of FIG. 7.

FIG. 10A illustrates an out-of-axis magnetic field sensor module 1000 configured to implement a method of measuring a magnetic field at an out-of-axis position (e.g., method 700).

The magnetic sensor module 1000 comprises a primary polewheel 1002a (i.e., a coarse polewheel) and a secondary polewheel 1002b (i.e., a fine polewheel mounted on a rotating shaft 1006 in a manner that causes the polewheels to be concentric about an axis 1014. The magnetic polewheels 1002 are separated from magnetic field sensors 1008 by an air gap 1012. The magnetic field sensors 1008 are configured to detect a magnetic field output from the polewheels. Over a mechanical 360° rotation the magnetic field sensors 1008 deliver two signals to a signal processor 1010, wherein the signal from the primary (coarse) pole wheel 1002a has a larger period than the signal from the secondary (fine) pole wheel 1002b.

Figure 10B:
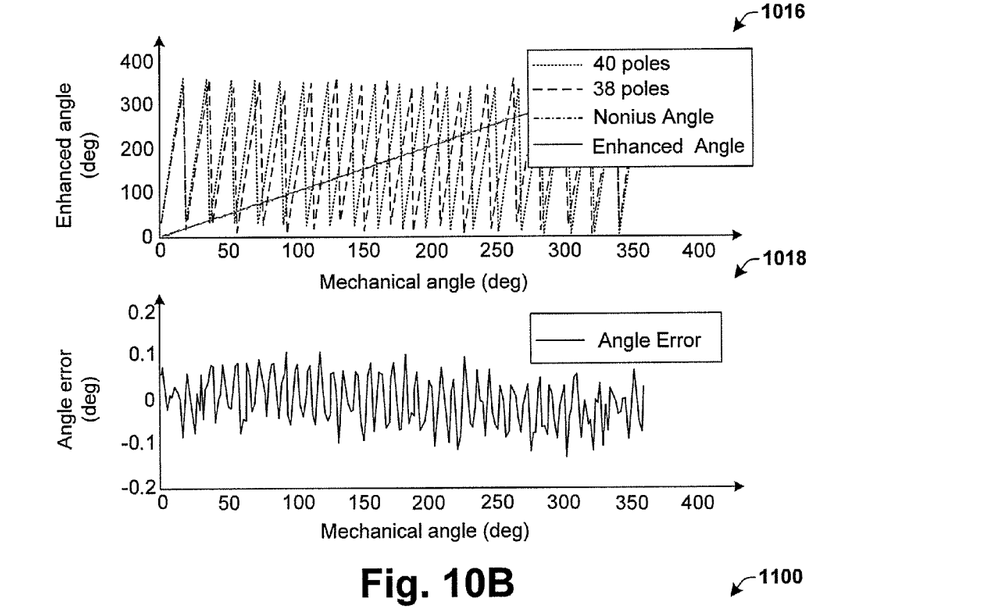
FIG. 10B illustrates simulation of an enhanced angle detected by the out-of-axis magnetic sensor of FIG. 10A and an associated error.

FIG. 10B illustrates simulation results of an enhanced angle $\theta_{enhanced}$ (or/and an adjusted enhanced angle) detected by the magnetic sensor module 1000 and an associated error. The enhanced angle (graph 1016) is measured for a primary polewheel (i.e., coarse polewheel) having 39 pole pairs and a fine polewheel (i.e., secondary polewheel) having 40 pole pairs. As shown in graph 1018, the error is +0.11°/−0.14°.

Figure 11:
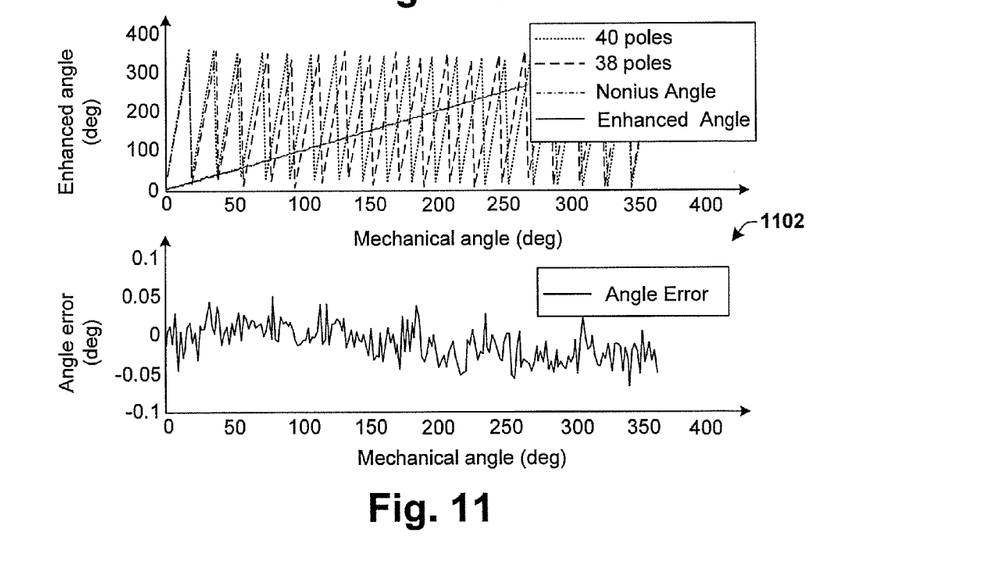
FIG. 11 illustrates graphs showing an enhanced angle detected by the out-of-axis magnetic sensor configured to implement an improved Nonius algorithm.

FIG. 11 illustrates graphs 1100, 1102 showing an enhanced or an adjust enhanced angle measured by multi-sensor magnetic sensor module (e.g., corresponding to multi-sensor magnetic sensor module 500) implementing method 800 and an associated error. Graph 1100 shows the enhanced angle (y-axis) (or/and an adjusted enhanced angle) as a function of an actual, mechanical angle (x-axis). Graph 1102 shows an error associated with the enhanced angle (y-axis) as a function of the actual, mechanical angle (x-axis). As shown in graph 1102, a multi-sensor magnetic sensor module 1000 that measures a magnetic field at an out-of-axis position using an improved Nonius principle of method 800 can achieve an accuracy of 0.06°/−0.07°.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A multi-sensor magnetic sensor module for angle measurement of a mechanical angle of rotation of a rotating device using a magnetic principle in an out-of-axis configuration, comprising:
    a first magnetic polewheel comprising a plurality of sections, having alternating polarities, located within a ring structure that generates a magnetic field that varies as a function of a mechanical angle of the first magnetic polewheel;
    a first magneto-resistive sensor having a structure that generates a first sensor signal corresponding to a first measured angle of the first magnetic polewheel; and
    a second magneto-resistive sensor having a structure that concurrently generates a second sensor signal corresponding to a second measured angle of the first magnetic polewheel;
    wherein the first magneto-resistive sensor comprises a first rotational orientation with respect to a first radial direction of the first magnetic polewheel;
    wherein the second magneto-resistive sensor comprises a second rotational orientation with respect to a second, different radial direction of the first magnetic polewheel; and
    wherein an angle between the first rotational orientation and the second rotational orientation is dependent upon a number of the plurality of sections in the first magnetic polewheel.

2. The multi-sensor magnetic sensor module of claim 1, where the the angle between the first rotational orientation and the second rotational orientation is equal to ninety degrees plus one-hundred and eighty degrees divided by the number of the plurality of sections.

3. The multi-sensor magnetic sensor module of claim 1,
    wherein the first magneto-resistive sensor is located at a first angular position; and
    wherein the second magneto-resistive sensor is located at a second angular position separated from the first angular position by a separation angle that causes the first magneto-resistive sensor to be in front of a center of a first section when the second magneto-resistive sensor is in front of a transition between adjacent sections.

4. The multi-sensor magnetic sensor module of claim 3, wherein the separation angle is equal to three-hundred-sixty degrees divided by two multiplied by the number of the plurality of sections.

5. The multi-sensor magnetic sensor module of claim 1, further comprising:
    a signal processor having a structure that receives the first sensor signal and the second sensor signal and to execute an algorithm that generates a value of an estimated mechanical angle being equal to an average of the first measured angle determined from the first sensor signal and the second measured angle determined from the second sensor signal.

6. The multi-sensor magnetic sensor module of claim 5, further comprising:
    a rotatable shaft having a structure that rotates about an axis of rotation extending through an origin of the first magnetic polewheel;
    a second magnetic polewheel having a smaller number of sections than the first magnetic polewheel, wherein the axis of rotation extends through an origin of the second magnetic polewheel; and
    a third magneto-resistive sensor located along a radial direction of the second magnetic polewheel and having a structure that generates a third sensor signal corresponding to a third measured angle of the second magnetic polewheel,
    wherein the estimated mechanical angle is determined as a function of the first sensor signal, the second sensor signal, and the third sensor signal.

7. The multi-sensor magnetic sensor module of claim 6, wherein the algorithm is further configured to perform the acts of:
    determining a position within a signal curve of the first polewheel as a function of the estimated mechanical angle;

determining the position within the signal curve as a signal period based upon the position within the signal curve of the first polewheel as a function of the estimated mechanical angle;

calculating an enhanced angle from the signal period and the first and second sensor signals; and adjusting the enhanced angle to eliminate error peaks.

8. The multi-sensor magnetic sensor module of claim 7, wherein determining the position within the signal curve of the first polewheel as a function of the estimated mechanical angle, comprises:

determining a fine angle associated with the estimated mechanical angle of the first magnetic polewheel;

determining a coarse angle associated with the third measured angle of the second magnetic polewheel; and calculating a difference between the fine angle and the coarse angle, wherein the difference corresponds to a Nonius angle.

9. The multi-sensor magnetic sensor module of claim 7, wherein the calculated enhanced angle corresponds to a measurement of the mechanical angle by the first magnetic polewheel, which has a larger number of sections than the first magnetic polewheel.

10. The multi-sensor magnetic sensor module of claim 7, wherein calculating the enhanced angle from the signal period, comprises:

calculating a threshold equal to three-hundred-and-sixty degrees multiplied by two and divided by the number of sections in the first polewheel;

calculating a signal period equal to a floor of the Nonius angle divided by the threshold; and calculating the enhanced angle by dividing the sum of the product of and the fine angle and the product of the signal period and three-hundred-and-sixty degrees divided by the number of sections in the first polewheel.

11. The multi-sensor magnetic sensor module of claim 7, wherein adjusting the enhanced angle to eliminate error peaks, comprises:

comparing the enhanced angle with the Nonius angle; and generating an adjusted enhanced angle that is equal to the enhanced angle minus the threshold if the difference of the enhanced angle and the Nonius angle is greater than a maximum Nonius angle error; or generating an adjusted enhanced angle that is equal to the enhanced angle plus the threshold if the difference of the enhanced angle and the Nonius angle is less than a maximum Nonius angle error.

12. A method of measuring an out-of-axis magnetic field, comprising:

providing a magnetic sensor module having a first magnetic field sensor configured to generate a first sensor signal corresponding to a magnetic field generated by a primary magnetic polewheel and one or more magnetic field sensors configured to generate at least a second sensor signal corresponding to a magnetic field generated by a secondary magnetic polewheel;

determining a position within a signal curve of the secondary magnetic polewheel as a signal period based upon the first sensor signal;

calculating an enhanced angle of the secondary magnetic polewheel from the position within the signal curve as the signal period and the second sensor signal; and adjusting the enhanced angle to eliminate error peaks.

13. The method of claim 12, wherein the one or more magnetic field sensors comprise:

a second magneto-resistive sensor having a structure that measures a magnetic field generated by the secondary magnetic polewheel and to generate the second sensor signal based upon the measured magnetic field; and a third magneto-resistive sensor having a structure that measures the magnetic field generated by the secondary polewheel and to generate a third sensor signal based upon the measured magnetic field;

wherein the secondary magnetic polewheel has a two more sections than the primary magnetic polewheel.

14. The method of claim 13, wherein determining the position within the signal curve as a signal period, comprises:

determining a coarse angle associated with the primary magnetic polewheel from the first sensor signal;

determining a fine angle associated with the secondary magnetic polewheel from the second and third sensor signals;

calculating a position within a signal curve of the secondary magnetic polewheel based on a difference between the fine angle and the coarse angle, wherein the difference corresponds to a Nonius angle of the primary magnetic polewheel; and determining a position within the signal curve of the secondary polewheel as a signal period based upon the position within a signal curve as the angle.

15. The method of claim 14, further comprising:

taking the modulo of the difference between the fine angle and the course angle and three-hundred-and-sixty degrees to determine the Nonius angle of the first magnetic polewheel.

16. The method of claim 14, wherein calculating an enhanced angle of the secondary magnetic polewheel from the position within the signal curve, comprises:

calculating a threshold equal to three-hundred-and-sixty degrees multiplied by two and divided by the number of sections in the primary magnetic polewheel;

calculating the signal period as equal to a floor of the Nonius angle divided by the threshold; and calculating the enhanced angle by dividing the sum of the product of two and the fine angle and the product of the signal period and three-hundred-and-sixty degrees by the number of sections in the primary magnetic polewheel.

17. The method of claim 14, wherein adjusting the enhanced angle to eliminate error peaks, comprises:

comparing the enhanced angle with the Nonius angle; and generating an adjusted enhanced angle that is equal to the enhanced angle minus the threshold if the difference of the enhanced angle with the Nonius angle is greater than a maximum Nonius angle error; or generating an adjusted enhanced angle that is equal to the enhanced angle plus the threshold if the difference of the enhanced angle with the Nonius angle is less than a maximum Nonius angle error.

* * * * *